United States Patent
Schlereth et al.

(10) Patent No.: US 9,385,258 B2
(45) Date of Patent: Jul. 5, 2016

(54) OPTOELECTRONIC SEMICONDUCTOR DEVICE WITH PROTECTIVE AND REFLECTIVE SHEATHS

(71) Applicant: OSRAM Opto Semiconductors GmbH, Regensburg (DE)

(72) Inventors: Thomas Schlereth, Regensburg (DE); Stephan Kaiser, Regensburg (DE); Alexander Linkov, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/376,165

(22) PCT Filed: Feb. 8, 2013

(86) PCT No.: PCT/EP2013/052549
§ 371 (c)(1),
(2) Date: Aug. 1, 2014

(87) PCT Pub. No.: WO2013/117700
PCT Pub. Date: Aug. 15, 2013

(65) Prior Publication Data
US 2015/0028361 A1    Jan. 29, 2015

(30) Foreign Application Priority Data
Feb. 10, 2012   (DE) .......................... 10 2012 101 102

(51) Int. Cl.
*H01L 31/12*   (2006.01)
*H01L 31/16*   (2006.01)
(Continued)

(52) U.S. Cl.
CPC .......... *H01L 31/16* (2013.01); *H01L 31/02325* (2013.01); *H01L 31/02327* (2013.01);
(Continued)

(58) Field of Classification Search
CPC ........... H01L 2224/48091; H01L 2924/00014; H01L 2224/73265; H01L 31/022408; H01L 31/02325; H01L 31/02327; H01L 31/16; H01L 33/46; H01L 33/52; H01L 33/60; H01L 33/58; H01L 33/486; H01L 2924/181; H01L 33/50; H01L 2924/12041; H01L 33/405; H01L 33/504
USPC .......................................................... 257/82
See application file for complete search history.

(56) References Cited

U.S. PATENT DOCUMENTS 6,900,511 B2    5/2005 Ruhnau et al.
2002/0185752 A1* 12/2002 Ishikawa et al. .............. 257/788
(Continued)

FOREIGN PATENT DOCUMENTS

DE  10 2010 029 368 A1   12/2011
EP     2 216 834 A1        8/2010
(Continued)

*Primary Examiner* — Duy T Nguyen
(74) *Attorney, Agent, or Firm* — DLA Piper LLP (US)

(57) ABSTRACT

An optoelectronic semiconductor device includes at least one radiation-emitting and/or radiation-receiving semiconductor chip including a radiation passage surface and a mounting surface opposite the radiation passage surface, wherein the mounting surface includes a first electrical contact structure and a second electrical contact structure electrically insulated from the first electrical contact structure, and wherein the radiation passage surface is free of contact structures, a reflective sheath surrounding the at least one semiconductor chip at least in sections, and a protective sheath surrounding the at least one semiconductor chip and/or the reflective sheath at least in sections.

15 Claims, 4 Drawing Sheets (51) Int. Cl.
*H01L 33/46* (2010.01)
*H01L 33/52* (2010.01)
*H01L 31/0224* (2006.01)
*H01L 31/0232* (2014.01)
*H01L 33/60* (2010.01)

(52) U.S. Cl.
CPC ........ *H01L31/022408* (2013.01); *H01L 33/46* (2013.01); *H01L 33/52* (2013.01); *H01L 33/60* (2013.01); *H01L 2224/48091* (2013.01); *H01L 2224/73265* (2013.01)

(56) References Cited

U.S. PATENT DOCUMENTS

| | | | |
|---|---|---|---|
| 2003/0094691 A1* | 5/2003 | Auch et al. | 257/704 |
| 2011/0175117 A1 | 7/2011 | Jagt et al. | |
| 2011/0248304 A1* | 10/2011 | Ichikawa | H01L 24/32 257/98 |
| 2011/0254039 A1 | 10/2011 | Kim et al. | |
| 2012/0287628 A1* | 11/2012 | Markell | F21V 5/043 362/235 |
| 2013/0077280 A1* | 3/2013 | Bemmerl et al. | 361/807 |

FOREIGN PATENT DOCUMENTS

| | | |
|---|---|---|
| WO | 2006/131843 A2 | 12/2006 |
| WO | 2010/035206 A1 | 4/2010 |
| WO | 2011/069791 A1 | 6/2011 |
| WO | 2011/160968 A1 | 12/2011 |
| WO | WO2011147636 * | 12/2011 |
| WO | 2012/007245 A1 | 1/2012 |
| WO | 2012/010400 A1 | 1/2012 |

* cited by examiner

OPTOELECTRONIC SEMICONDUCTOR DEVICE WITH PROTECTIVE AND REFLECTIVE SHEATHS

TECHNICAL FIELD

This disclosure relates to an optoelectronic device comprising a semiconductor chip and a reflective sheath, as well as an arrangement having a plurality of such semiconductor devices.

BACKGROUND

EP 2 216 834 A1 describes an optoelectronic semiconductor device.

Some devices comprise a lead frame having a suitable plastic material injection-molded around it. The plastic material forms a basic housing comprising a cavity in which a semiconductor chip is arranged and electrically contacted. To increase the external efficiency in such devices, it is conventional to form the cavity with inclined inner surfaces so that they serve as a reflector. The semiconductor chip in the cavity mostly emits radiation directed forwardly, sidewardly and rearwardly. In those devices, in spite of the inclined cavity inner surfaces sideward- or rearward-emitted light of the semiconductor chip is absorbed at least partially by the basic housing, which means that the light portion disadvantageously does not contribute to the forward light current of the device.

Moreover, in some devices, absorption losses of the radiation emitted by the semiconductor chip can occur on absorbing contact structures arranged, e.g., at a radiation passage side of the semiconductor chip. Moreover, by reason of the properties of the semiconductor chip as a volume emitter, efficient coupling of light into optical elements such as, e.g., into waveguides, cannot easily be accomplished using such devices.

To counteract those disadvantages at least in part, it is possible to use a housing material which is preferably reflective. However, some reflective housing materials have for the most part disadvantageous properties such as, e.g., low thermal conductivity. Alternatively or in addition, it is possible to use large-area contact surfaces consisting of, e.g., silver to recover light emitted in the rearward direction. However, shadowing effects can occur which means that an optimum forward light current also cannot be achieved.

Thus, there is a need to provide an optoelectronic semiconductor device characterized by an increased forward light current and at the same time permits efficient coupling of light into optical elements, wherein the device can also be produced having just a small height.

SUMMARY

We provide an optoelectronic semiconductor device including at least one radiation-emitting and/or radiation-receiving semiconductor chip including a radiation passage surface and a mounting surface opposite the radiation passage surface, wherein the mounting surface includes a first electrical contact structure and a second electrical contact structure electrically insulated from the first electrical contact structure, and wherein the radiation passage surface is free of contact structures, a reflective sheath surrounding the at least one semiconductor chip at least in sections, and a protective sheath surrounding the at least one semiconductor chip and/or the reflective sheath at least in sections.

We also provide an optoelectronic semiconductor device including at least one radiation-emitting and/or radiation-receiving semiconductor chip including a radiation passage surface and a mounting surface opposite the radiation passage surface, wherein the mounting surface includes a first electrical contact structure and a second electrical contact structure electrically insulated from the first electrical contact structure, and wherein the radiation passage surface is free of contact structures, a reflective sheath surrounding the at least one semiconductor chip at least in sections, and a protective sheath surrounding the at least one semiconductor chip and/or the reflective sheath at least in sections, wherein a conversion element is disposed on the radiation passage surface of the semiconductor chip which converts the radiation, is emitted by the semiconductor chip, at least partially into radiation of a different wavelength, the conversion element not being covered by the reflective sheath.

BRIEF DESCRIPTION OF THE DRAWINGS

FIGS. 1A to 2B show schematic sections of an example of a semiconductor device.

DETAILED DESCRIPTION

Our optoelectronic semiconductor devices may comprise at least one radiation-emitting and/or radiation-receiving semiconductor chip. The semiconductor chips may comprise a radiation passage surface and a mounting surface opposite the radiation passage surface. The mounting surface comprises a first electrical contact structure and a second electrical contact structure electrically insulated from the first electrical contact structure. The radiation passage surface is, e.g., free of contact structures. Furthermore, the semiconductor device may comprise a reflective sheath surrounding the at least one semiconductor chip at least in sections. Moreover, the semiconductor device may comprise a protective sheath surrounding the at least one semiconductor chip and/or the reflective sheath at least in sections.

The radiation passage surface is the surface through which during operation of the semiconductor chip a large portion of the generated radiation exits or a large portion of the radiation to be detected enters. For example, at least 50%, in particular at least 75%, of the respective radiation passes through the radiation passage surface.

The fact that the semiconductor chip is surrounded at least in sections by the reflective sheath causes a change, in particular an increase, in the reflectivity of the direct surrounding area of the semiconductor chip. In particular, the reflective sheath suppresses sideward and rearward emission of the semiconductor chip. Therefore, the light of the semiconductor chip emitted sidewardly and rearwardly cannot be absorbed by a housing body arranged, e.g., subsequent to the reflective sheath. Advantageously, this light is partially scattered or reflected in the forward direction of the device and thus increases the forward light current. Furthermore, the reflective sheath increases reflectivity of the entire device, whereby absorption losses can be reduced, as back-scattered light is provided once again through the forward direction.

To mount and electrically contact the semiconductor chip, the optoelectronic semiconductor device comprises, e.g., a housing body having a cavity or a lead frame. To electrically contact the semiconductor chip, the cavity or the lead frame comprises electrical contact structures on the mounting side. Alternatively, it is possible for the optoelectronic semiconductor device to comprise a connection carrier to mount and electrically contact the semiconductor chip. The connection carrier comprises, e.g., an electrically insulating base body on which and/or in which contact structures that contact the semiconductor chip are present. The base body can be formed, e.g., with a ceramic material or with a plastic material. The connection carrier can also be formed in a planar manner and without cavities.

The contact structures can be formed to be absorbent. For example, for contacting or heat-spreading purposes, such contact structures comprise gold (Au) as the material. The reflective sheath advantageously covers the contact structures, e.g., the cavity, in particular the mounting side, or the lead frame so that the absorbent contact structures are covered with material of the reflective sheath. As a result, absorption losses can be avoided or at least reduced at these contact structures. Radiation emitted by the semiconductor chip in the direction of the contact structures of the housing body or the lead frame or the connection carrier is scattered or reflected in the forward direction in particular at the reflective sheath and constitutes a proportion of the forward light current of the semiconductor device. The semiconductor chip comprises electrical contact structures merely on the mounting surface. The radiation passage surface is free of contact structures. The semiconductor chip is therefore a so-called "flip-chip," the electrical contacting of which is effected merely by one side of the semiconductor chip. As a result, the semiconductor chip preferably does not have any absorbent contact structures or current spreading layers on the radiation passage side, through which the forward-scattered light of the semiconductor chip could be at least partially absorbed. Absorption losses at such current spreading layers and/or contact layers arranged at the radiation passage surface are thus avoided which means that the light yield, in particular the forward light current of the semiconductor device, increases further.

Furthermore, the device height can be reduced overall in an advantageous manner by the semiconductor chip comprising one-sided electrical contacting. In particular, the height of the reflective sheath can be reduced considerably by virtue of the non-existent wire contacting. On the whole, a device can thus be produced which is characterized by its low height and an increased light yield in the forward direction.

The protective sheath is used preferably to mechanically stabilize the device. As a consequence, a separate protective housing is preferably not required, thus advantageously reducing the costs of such a device. Moreover, the light losses are reduced, as absorption losses at a separate protective housing can be avoided. Devices having such a mechanically stabilizing protective sheath are also advantageously characterized by a high degree of reliability.

The semiconductor device is an optoelectronic device permitting conversion of electrically generated data or energies into light emission or vice versa. The semiconductor device comprises an optoelectronic semiconductor chip, preferably a radiation-emitting semiconductor chip. The semiconductor chip is preferably an LED (light-emitting diode), particularly preferably a flip-chip LED.

The semiconductor chip comprises a semiconductor layer stack in which an active layer is contained. The active layer preferably contains a pn-transition, a double heterostructure, a single quantum well (SQW) structure or a multi quantum well (MQW) structure to generate radiation. In this case, the designation quantum well structure does not indicate any significance in terms of the dimensionality of the quantization. It includes inter alia quantum wells, quantum wires and quantum dots and any combination of these structures.

The semiconductor layer stack of the semiconductor chip preferably contains a III/V-semiconductor material. III/V-semiconductor materials are particularly suitable for generating radiation in the ultraviolet to the visible to the infrared spectral ranges.

Individual components of the semiconductor device are surrounded at least in sections by further components of the device. For example, sections of the semiconductor chip are surrounded by the reflective sheath. The protective sheath surrounds, e.g., the semiconductor chip or reflective sheath in sections. The term "sheath" is to be understood in particular to mean that the respective sheath encircles, surrounds and/or borders the component to be surrounded and is thus arranged around this component to be surrounded. A spaced interval can be arranged between the sheath and the component to be surrounded. In the case of the sheath, it is not absolutely necessary for the respective sheath to directly adjoin the component to be surrounded.

Preferably, the reflective sheath surrounds at least sections of the semiconductor chip in direct contact. Therefore, a spaced interval cannot be arranged between the reflective sheath and the semiconductor chip. For example, side surfaces of the semiconductor chip are in direct contact with the reflective sheath. The radiation passage surface of the semiconductor chip does not necessarily have to be enclosed by the reflective sheath.

The protective sheath surrounds the reflective sheath and/or the semiconductor chip preferably at least in sections at a spaced interval. This means that a spaced interval is arranged between the reflective sheath and/or the semiconductor chip and the protective sheath. This spaced interval is. e.g., free of material or can contain a further additional material, e.g., a converter casting compound.

Alternatively, the protective sheath is arranged in direct contact with the reflective sheath. Therefore, a spaced interval is not arranged between the reflective sheath and the protective sheath. At the radiation passage surface of the semiconductor chip, the protective sheath can be in direct contact with the semiconductor chip.

The semiconductor chip may be a volume emitter and the semiconductor device may be, by virtue of the reflective sheath, a surface emitter. The term "volume emitter" means that the semiconductor chip does not merely emit radiation from the chip at the radiation passage surface, but rather that proportionately radiation can also exit the semiconductor chip at the side surfaces thereof. In contrast, a surface emitter means that this emitter couples out the largest proportion of the emitted radiation at the radiation passage surface so that no radiation or scarcely any radiation exits the emitter at the side of the emitter.

The volume-emitting properties of the semiconductor chip are converted by the reflective sheath into surface-emitting properties. In particular, this is effected preferably with a reflective sheath formed up to an upper chip edge at the radiation passage surface of the semiconductor chip. Particularly preferably, the reflective sheath extends at the most to an upper chip edge of the semiconductor chip. As a result, the sideward and rearward emission of the semiconductor chip is suppressed. This proportion of the radiation emitted by the semiconductor chip is partially reflected or scattered in the forward direction and thus increases the forward light current.

In this case, the radiation exits, as in the case of a surface emitter, only from the chip upper side, i.e., from the radiation passage surface. On the whole, the radiation emission is thus extensively forward-directed. This produces a considerable efficiency advantage compared to a device having volume-emitting properties. An increase in efficiency of the radiation of up to 10% can be achieved advantageously thereby and by the suppression of the absorption at contact structures.

By reason of the surface-emitting properties of the semiconductor device, subsequent processes and concepts of a typical surface emitter can be applied to the device such as, e.g., layer transfer to apply a converter material on the semiconductor chip. Moreover, alternative conversion technique, such as, e.g., sedimentation, thin volume casting, EPD or spray-coating can be applied very easily to such surface emitters.

Moreover, by reason of the surface-emitting properties of the semiconductor device, it is advantageously possible to ensure efficient coupling of light into optical elements such as, e.g., waveguides. For this purpose, simple constructions are possible for illumination applications and backlighting applications. In particular, by reason of the extensively forwardly directed radiation and the low device height, the device can be mounted without further lenses in proximity to a waveguide, whereby the emission surface of the device is arranged in proximity to the coupling-in surface of the optical element. In addition, the incidence of light at a small angle with respect to the surface normal of the coupling-in surface of the waveguide produces small back-scattering effects by virtue of total reflection.

In this case, an additional housing advantageously does not have to be used, as the mechanical stability of the device is already ensured by the protective sheath.

A region at the mounting surface between the first electrical contact structure and the second electrical contact structure may be free of material of the reflective sheath. Preferably, the first electrical contacting is arranged at the mounting surface at a spaced interval with respect to the second electrical contacting. This spaced interval is preferably free of material of the reflective sheath and ensures in particular electrical insulation of the first electrical contact structure from the second electrical contact structure. A reflective sheath is not required in this region, as radiation emitted by the semiconductor chip in the direction of the mounting surface would then merely be reflected back into the semiconductor chip where it would be absorbed by the semiconductor chip. Therefore, this radiation proportion would not contribute to the light emission from the device. As a result, the region on the mounting surface can be recessed with material of the reflective sheath, whereby overall less material of the reflective sheath is required.

The reflective sheath may contain light-scattering and/or light-reflecting particles. These particles are particularly suitable to deflect the light emitted by the semiconductor chip in the forward direction.

The light-scattering and/or light-reflecting particles may be $TiO_2$ particles, $BaSO_4$ particles, ZnO particles, $Al_xO_y$ particles and/or $ZrO_2$ particles.

The reflective sheath may comprise a silicone filled with light-scattering and/or light-reflecting particles. In particular, the light-scattering or light-reflecting particles may be incorporated in the silicone. Preferably, the particles are incorporated homogeneously in the silicone so that the radiation which is emitted sidewardly or rearwardly by the semiconductor chip is deflected homogeneously in the forward direction.

In particular, it is possible that the reflective sheath appears white by reason of the light-scattering and/or light-reflecting particles. It is also possible that the sheath contains color pigments so that the sheath reflects radiation but appears black or colored.

The protective sheath may be transparent to the radiation emitted by the semiconductor chip. The term "transparent" means that a large proportion of the radiation emitted by the semiconductor chip passes through the protective sheath without influencing the radiation direction or radiation wavelength. The term "a large proportion" means that at least 70% of the radiation emitted by the semiconductor chip, preferably at least 80% of the radiation, preferably at least 90% of the radiation, passes without influence through the protective sheath.

A conversion element may be arranged on the radiation passage surface of the semiconductor chip that converts the radiation, which is emitted by the semiconductor chip, at least partially into radiation of a different wavelength. In this case, the semiconductor device emits mixed radiation composed of a proportion of the radiation emitted by the semiconductor chip and a proportion of the converted radiation. A proportion of the radiation emitted by the semiconductor chip thus passes unconverted through the conversion element. Consequently, it is advantageously possible to produce a device which emits white mixed radiation.

The conversion element is, e.g., a conversion plate applied by a layer transfer onto the radiation passage surface of the semiconductor chip. In this case, the conversion plate is arranged directly downstream of the radiation passage surface. Alternatively, the conversion element can be arranged downstream of the radiation passage surface of the semiconductor chip by a sedimentation process. In this case, the conversion element, in particular conversion particles, is deposited directly on the radiation passage surface. Alternatively, the conversion element can be arranged downstream of the radiation passage surface by thin volume casting. Moreover, the conversion element can be arranged on the radiation passage surface of the semiconductor chip by an EPD method (electrophoretic method) or a spray-coating method.

The conversion element may remain uncovered by the reflective sheath.

The semiconductor chip and the reflective sheath may be arranged on a preferably planar carrier substrate, wherein the reflective sheath is delimited by a border surrounding the semiconductor chip. The reflective sheath may be formed, e.g., by a casting compound, wherein the circumferential border forms a casting compound stop edge for spatially delimiting the casting compound on the planar carrier substrate. The circumferential border is preferably arranged at a spaced interval continuously around the semiconductor chip on the carrier substrate so that the reflective sheath formed as a casting compound is completely delimited by the casting compound stop edge.

The reflective sheath may extend from the carrier substrate to the semiconductor chip. Preferably, at least one surface of the reflective sheath extends obliquely with respect to the carrier substrate. In particular, the obliquely extending surface does not adjoin the semiconductor chip but rather is remote therefrom. The surface can extend at an angle greater than zero and less than 90° with respect to the carrier substrate. Particularly preferably, at least one surface is curved. Such a configuration of the reflective sheath can further improve the forward light current.

An optical element may be disposed downstream of the semiconductor chip in the radiation direction. The optical element may be, e.g., a waveguide, into which the radiation emitted by the device can be coupled in a particularly efficient manner by virtue of the surface-emitting properties of the semiconductor device.

An arrangement may comprise a plurality of semiconductor devices arranged on a common carrier substrate. In this case, the semiconductor devices are preferably arranged adjacent one another on the carrier substrate. For example, the semiconductor devices are arranged matrix-like on the carrier substrate. That is to say, the semiconductor devices can be arranged, e.g., on the grid points of a regular grid. The arrangement can be used as a display to show images. It is also possible for the arrangement to be used to backlight an imaging element such as, e.g., an LCD panel. Furthermore, the arrangement can be used as an illumination apparatus, e.g., in general lighting.

The features stated in conjunction with the semiconductor device are also used in connection with the arrangement and vice versa.

Further advantages and advantageous developments will be apparent from the examples described hereinafter in conjunction with FIGS. 1 to 6.

In the figures, like elements, or elements acting in an identical manner, can be provided with the same reference numerals in each case. The illustrated elements and their size ratios with respect to each other are not to be regarded as being to scale. Rather, individual elements such as, e.g., layers, structures, components and regions, may be illustrated excessively thick or large to provide a clearer illustration and/or for greater ease of understanding.

Figure 1A:
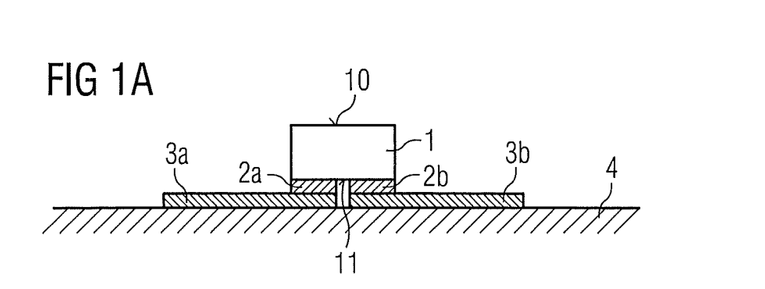

FIG. 1A illustrates a cross-section of a semiconductor device which is not yet finished. The semiconductor device comprises a radiation-emitting semiconductor chip 1 which comprises a radiation passage surface 10. Formed on the side of the semiconductor chip 1 opposite to the radiation passage surface 10 is a mounting surface 11, by which the semiconductor chip 1 is electrically and mechanically contacted. In particular, the mounting surface 11 comprises a first electrical contact structure 2a and a second electrical contact structure 2b. The electrical contact structures 2a, 2b are electrically insulated from one another by a spaced interval. By the first electrical contact structure 2a, the semiconductor chip is attached, in particular electrically and mechanically contacted, on a first metal contact 3a and by the second electrical contact structure 2b the semiconductor chip is attached, in particular electrically and mechanically contacted, on a second metal contact 3b of a carrier substrate 4. The first metal contact 3a and the second metal contact 3b of the carrier substrate 4 are likewise electrically insulated from one another by a spaced interval.

Therefore, the semiconductor chip 1 is electrically contacted merely by the mounting surface 11. This means that the radiation passage surface is free of contact structures. The radiation passage surface 10 is thus not covered by absorbent contact structures which can lead to an efficiency loss of the exit radiation from the semiconductor chip 1. The semiconductor chip 1 is formed as a flip-chip.

The semiconductor chip 1 comprises a semiconductor layer stack, in particular epitaxially deposited layers, which have been grown, e.g., on a growth substrate of the semiconductor chip 1. In this case, the growth substrate can be detached at least partially or even completely from the semiconductor layers of the layer stack after the layers have been grown. The semiconductor chip 1 can thus be formed as a thin-film chip. That is to say, the semiconductor chip 1 is, e.g., free of a growth substrate. The semiconductor chip 1 can comprise a carrier to which the epitaxially grown layer stack is attached. A reflective layer, e.g., consisting of silver, can be arranged between the carrier and the layer stack.

The semiconductor chip 1 is a volume emitter. This means that the radiation emitted in an active layer of the semiconductor chip 1 exits the semiconductor chip 1 on all sides thereof. In particular, a proportion of the radiation emitted in the active layer also exits at side surfaces of the semiconductor chip 1. However, such side and also rear emissions of the semiconductor chip 1 disadvantageously do not contribute to the forward emission. To recover these sideward- and rearward-emitting beams of the semiconductor chip 1 and thus to increase the forward emission of the semiconductor chip overall, the semiconductor device is provided with a reflective sheath which surrounds the semiconductor chip 1 at least in sections (not illustrated). The reflective sheath is illustrated and explained in greater detail in FIGS. 2A to 6B hereinafter.

Moreover, the semiconductor device further comprises a protective sheath which surrounds the semiconductor chip 1 and/or the reflective sheath at least in sections (not illustrated). The protective sheath will be discussed in greater detail with reference to FIGS. 3A to 3D hereinafter.

The first electrical contact structure 2a and the second electrical contact structure 2b of the semiconductor chip 1 can be contact layers which contain, e.g., gold. For example, the contact structures 2a, 2b are solder layers and/or gold intermediate layers.

Figure 1B:
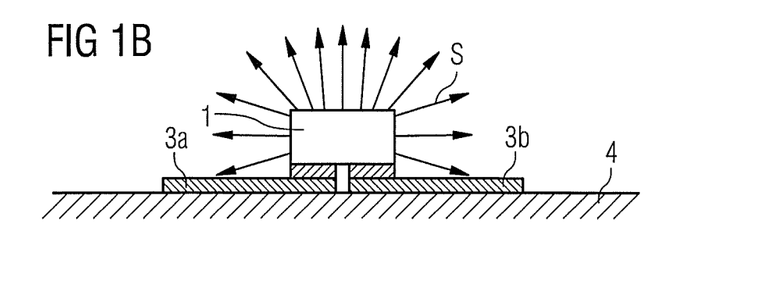

FIG. 1B illustrates in greater detail the volume emission of the semiconductor chip 1 of the example of FIG. 1A. The radiation emission is graphically illustrated in particular by arrows S. The radiation S emitted by the active layer of the semiconductor chip exits the semiconductor chip 1 at the radiation passage surface 10 and also at the side surfaces thereof. Therefore, the volume emitter emits forward-directed as well as sideward-directed and rearward-directed radiation. The rearward-directed radiation impinges upon the metal contacts 3a, 3b of the carrier substrate 4 where it can be disadvantageously absorbed so that these beams do not contribute to the forward emission of the semiconductor device.

By the semiconductor device, these sideward- and rearward-directed beams emitted by the semiconductor chip are recovered and directed in the direction of forward emission. This is effected by the reflective sheath 5 illustrated inter alia in the example of FIG. 1C.

Figure 1C:
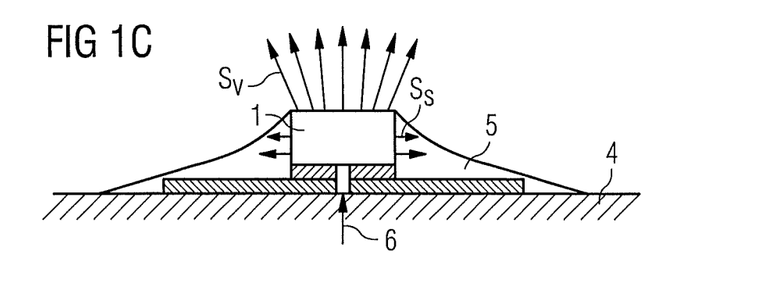

In particular, the example of FIG. 1C differs from the example of FIG. 1B in that the reflective sheath 5 surrounds the semiconductor chip 1 at least in sections. In particular, the semiconductor chip 1 is cast with the reflective coating as far as to the chip upper edge. A surface of the reflective sheath 5 remote from the semiconductor chip 1 extends from the carrier substrate 4 to the chip upper edge and extends obliquely with respect to the carrier substrate 4. In particular, all of the surfaces of the reflective sheath 5 remote from the semiconductor chip 1 extend from the carrier substrate 4 to the chip upper edge and extend obliquely with respect to the carrier substrate 4. Furthermore, the at least one obliquely extending surface is advantageously provided with a curvature. The beams $S_S$ of the semiconductor chip 1 emitted sidewardly and rearwardly are deflected in the reflective sheath 5 in the direction of the radiation passage surface 10. As a result, the sideward and rearward emission is suppressed and the forward emission $S_F$ is enhanced. At the same time, the absorption effects at the metal contacts 3a, 3b of the carrier substrate 4 can be suppressed by the reflective sheath 5 since the beams $S_S$ emitted sidewardly and rearwardly are scattered or reflected in the reflective sheath 5 in the direction of the radiation passage surface 10 of the semiconductor chip 1 prior to reaching the metal contacts 3a, 3b.

The semiconductor chip formed as a volume emitter is converted into a surface emitter by the reflective sheath 5. Therefore, by reason of the reflective sheath 5 the semiconductor device is formed on the whole as a surface emitter. This means that the largest proportion of radiation emitted by the active layer of the semiconductor chip 1 exits the radiation passage surface 10.

The reflective sheath 5 contains light-scattering and/or light-reflecting particles to permit deflection of the sideward- and rearward-emitting beams $S_S$ in the direction of forward emission $S_V$. For example, the reflective sheath 5 contains $TiO_2$ particles, $BaSO_4$ particles, $ZnO$ particles, $Al_xO_y$ particles and/or $ZrO_2$ particles. Particularly preferably, the reflective sheath 5 is a silicone which is filled with these light-scattering and/or light-reflecting particles.

Preferably, the spaced interval between the first electrical contact structure 2a and the second electrical contact structure 2b is free of material of the reflective sheath. Therefore, the region between the first metal contact 3a and the second metal contact 3b of the carrier substrate 4 is also free of material of the reflective sheath 5.

Figure 1D:
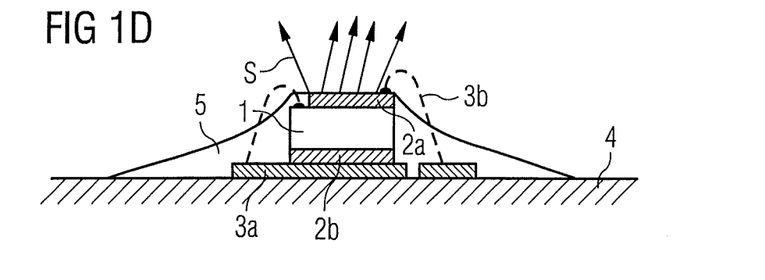

In the example of FIG. 1D, in contrast to the preceding example, a semiconductor chip 1 is illustrated which is not formed as a flip-chip. This semiconductor chip 1 comprises in particular at the radiation passage surface 10 electrical contact structures connected to the metal contacts 3a of the carrier substrate 4 in an electrically conductive manner, e.g., by a bond wire 3b. However, this existing wire contacting disadvantageously increases the minimum casting compound height and the height of the semiconductor chip. Therefore, compared to the semiconductor chip of FIG. 1D, the semiconductor chip formed as a flip-chip as shown in FIGS. 1A to 1C can be used to produce a semiconductor device with a low constructional height and also a low casting compound height of the reflective sheath. Moreover, by reason of the flip-chip configuration, it is possible to avoid absorption losses at the contact structures of the radiation passage surface.

Figure 2A:
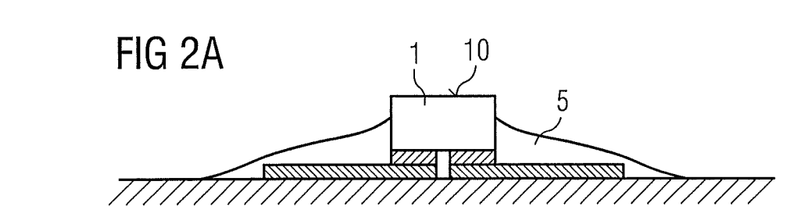

FIG. 2A illustrates a semiconductor device which in contrast to the example illustrated in FIG. 1C comprises a reflective sheath 5 which does not extend to the chip upper edge. Depending upon the respectively desired application and usage of the semiconductor device, the height of the casting compound of the reflective sheath 5 can be adjusted. On the whole, it is necessary to ensure that the height of the reflective sheath is configured such that the lateral emission or at least the back-emission of the semiconductor chip 1 is deflected in the direction of the radiation passage surface so that overall the forward emission of the device is enhanced and any possible absorbing structures, in particular contact structures, are covered.

Figure 2B:
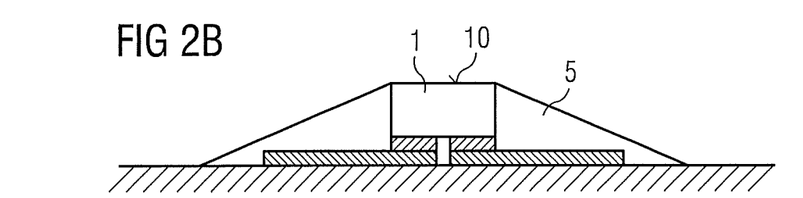

In the example of FIG. 2B, in contrast to the example of FIG. 2A, the reflective sheath 5 is formed as far as to the upper chip edge of the semiconductor chip 1. As a result, all sideward- and rearward-emitting beams can be deflected advantageously in the direction of the radiation passage surface 10 to ensure the most optimum forward emission possible.

FIGS. 3A to 3D illustrate a semiconductor device having a protective sheath 8, wherein the protective sheath 8 surrounds the semiconductor chip 1 and/or the reflective sheath 5 at least in sections. In the case of the following examples, the semiconductor chip 1 and the reflective sheath 5 correspond to the semiconductor chip 1 and the reflective sheath 5 of the preceding examples.

Figure 3A:
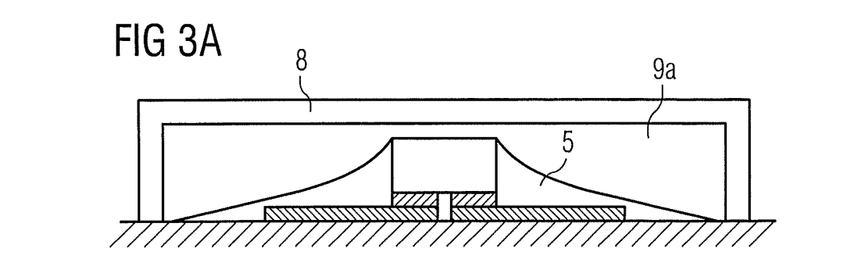
FIGS. 3A to 3D show schematic cross-sections of an example of a semiconductor device.

In the device in accordance with the example of FIG. 3A, the semiconductor chip 1 and the reflective sheath 5 are cast by a conversion element 9a. In this case, the conversion element 9a is a volume casting compound containing a converter material. The converter material particularly converts the radiation emitted by the semiconductor chip 1, at least partially into radiation of a different wavelength.

In this case, the conversion element 9a is arranged inter alia downstream of the radiation passage surface 10 of the semiconductor chip 1 so that radiation emitted from the radiation passage surface 10 enters the conversion element 9a where it is converted at least partially into radiation of a different wavelength. Therefore, the semiconductor device emits on the whole mixed radiation of the radiation emitted by the semiconductor chip 1 and the radiation converted by the conversion element 9a. For example, the device emits on the whole white radiation.

Arranged downstream of the conversion element 9a is the protective sheath 8 which in this case is formed as a cover or lid. The protective sheath is preferably transparent to the radiation emitted by the semiconductor chip 1 and to the radiation converted by the conversion element 9a. The beams emitted by the semiconductor chip 1 and by the conversion element 9a pass preferably without influence through the protective sheath.

The protective sheath 8 is designed preferably as a casting compound and serves in particular to mechanically stabilize the device on the whole. A separate and further protective housing is thus advantageously not required, thus reducing costs and light losses on the whole and increasing the reliability of the device.

Figure 3B:
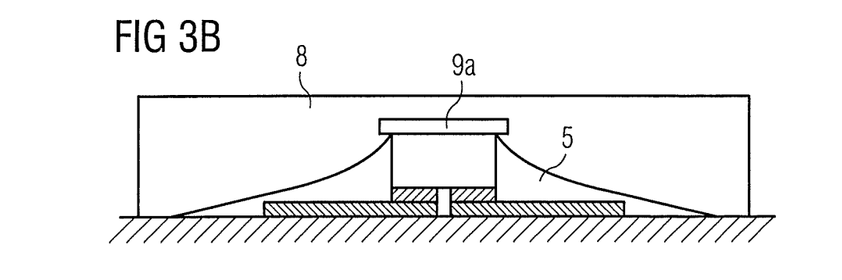

The example of FIG. 3B differs from the example of FIG. 3A in that the conversion element 9a is not formed as a volume casting compound but rather is merely attached on the radiation passage surface 10 and is applied as a conversion layer. The conversion element 9a is thus formed much smaller. Preferably, the conversion element is a separate conversion plate which has been applied to the semiconductor chip 1, e.g., by a layer transfer. In particular, the conversion element 9a remains uncovered by the reflective sheath 5.

The protective sheath 8 may cast the reflective sheath 5 and the conversion element 9a preferably completely and may be formed as a volume casting compound. The protective sheath 8 serves in turn to mechanically stabilize the device on the whole and preferably comprises transparent properties for the converted radiation and the emitted radiation.

Figure 3C:
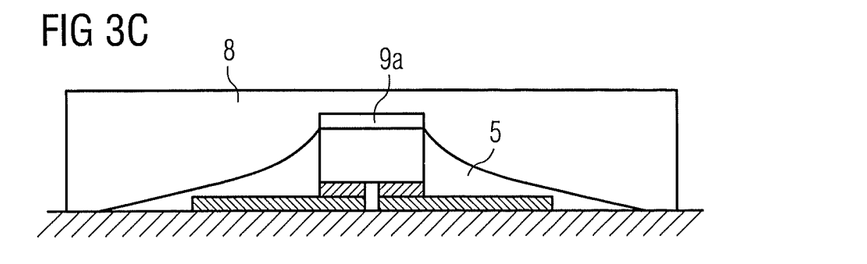

The example of FIG. 3C differs from the example of FIG. 3B in that the conversion element 9a is not formed as a converter plate but rather is a converter layer deposited on the radiation passage surface 10 of the semiconductor chip 1 and is produced, e.g., by an EPD method.

Figure 3D:
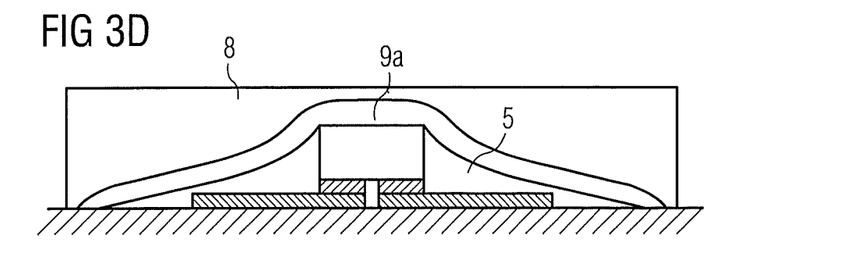

In the example of FIG. 3D, the conversion element 9a is formed as an enclosure of the semiconductor chip 1 including the reflective sheath 5. An enclosure formed in this manner is produced, e.g., by sedimentation or spray-coating. The conversion element 9a is, in turn, cast and mechanically stabilized by the protective sheath 8.

Figure 4A:
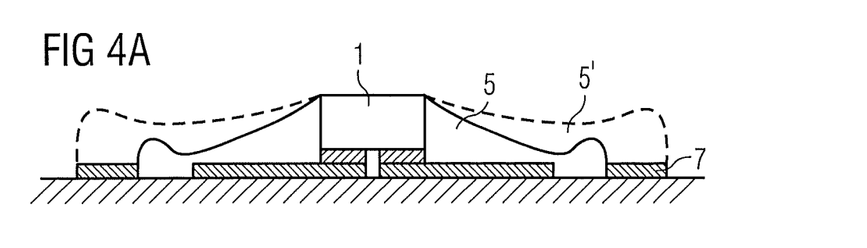
FIGS. 4A and 4B show schematic views of an example of a semiconductor device.

The example of FIG. 4A differs from the preceding examples in that the reflective sheath 5 is delimited by a border 7 surrounding the semiconductor chip 1. The border 7 is, e.g., a casting compound stop edge spatially delimiting the reflective sheath 5 formed as a casting compound. This is advantageous in particular when using a planar and flat carrier substrate 4. The inner edge of the border 7 facing towards the semiconductor chip 1 can function as a casting compound stop edge. In this case, the border 7 remains free of the sheath 5. Alternatively, it is possible (see dashed line) for the outer edge of the border 7 remote from the semiconductor chip 2 to function as a casting compound stop edge. The sheath 5' then covers the border 7. This can prove to be advantageous if the border 7 is formed to absorb radiation.

Figure 4B:
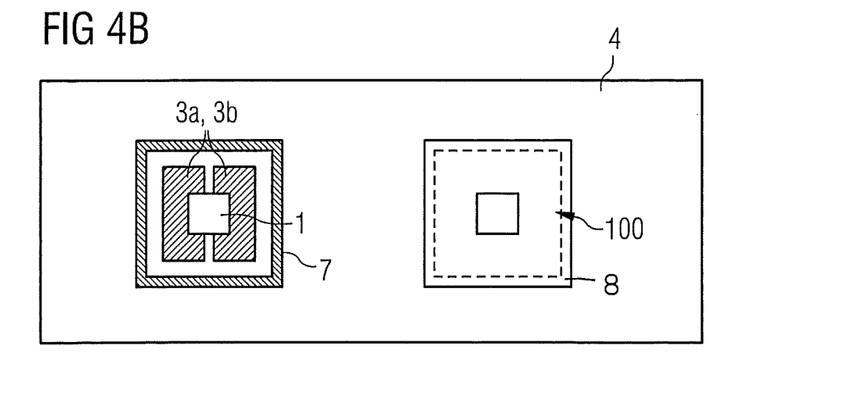

FIG. 4B shows a top view of the example of FIG. 4A. The semiconductor device illustrated on the left-hand side of FIG. 4B comprises the border 7 surrounding the semiconductor chip and is formed in particular without interruption. The semiconductor chip 1 is arranged on the metal contacts 3a, 3b, wherein the semiconductor chip 1 and the metal contacts 3a, 3b are arranged completely within the border 7. In this case, the border 7 is formed at a spaced interval with respect to the metal contacts 3a, 3b and with respect to the semiconductor chip 1 and is preferably in the shape of a cuboid or a rectangle. However, alternative shapes such as circular, oval or any other configurations, are also feasible.

The device on the right-hand side of FIG. 4B comprises the protective sheath 8 applied on the reflective sheath and the semiconductor chip. Thereby, the protective sheath 8 covers the semiconductor chip 1 and the metal contacts 3a, 3b completely and is spatially delimited by the border 7. Preferably, the protective sheath 8 likewise comprises a rectangular or cuboidal formation in a top view. However, alternative shapes such as circular, oval or any other configurations, are also feasible.

Figure 5:
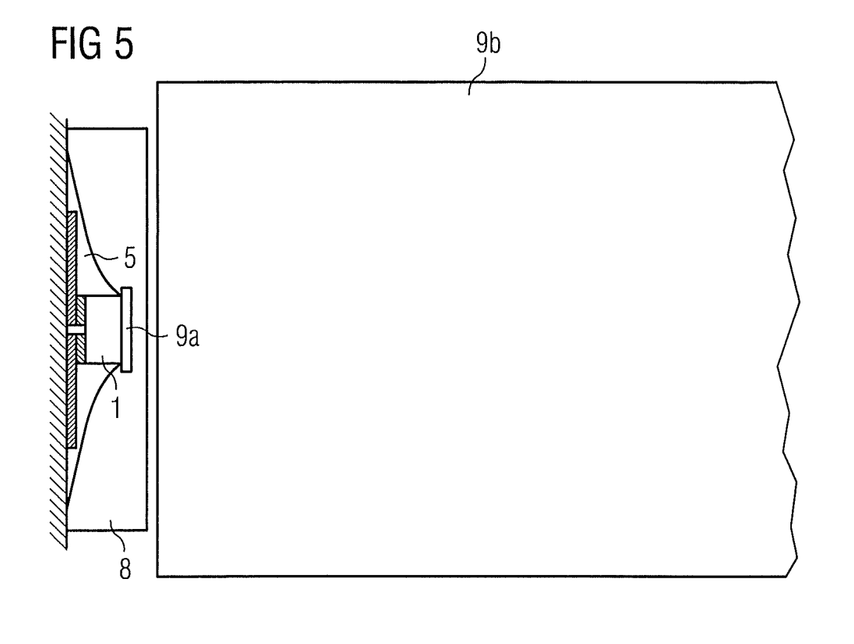
FIG. 5 shows a schematic cross-section of an example of a semiconductor device.

The example of FIG. 5 illustrates a semiconductor device in accordance with one of the examples of FIGS. 3A to 3D which in the radiation direction has an optical element 9b disposed downstream thereof. The optical element 9b is, e.g., a waveguide, in which the radiation emitted by the semiconductor device is coupled-in. A semiconductor device having a waveguide disposed downstream is used, e.g., for illumination and/or backlighting applications. In this case, by reason of the low device height the waveguide can advantageously be disposed as closely as possible to the radiation passage surface of the semiconductor chip. This advantageously ensures efficient coupling of light into the waveguide.

Figure 6A:
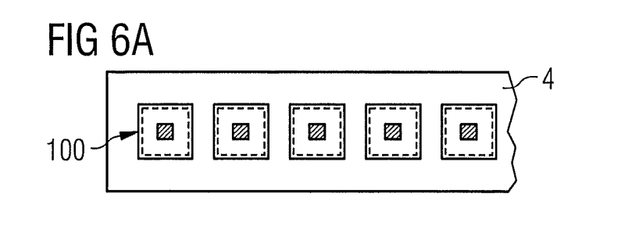
FIGS. 6A and 6B show schematic views of an example of an arrangement.
Figure 6B:
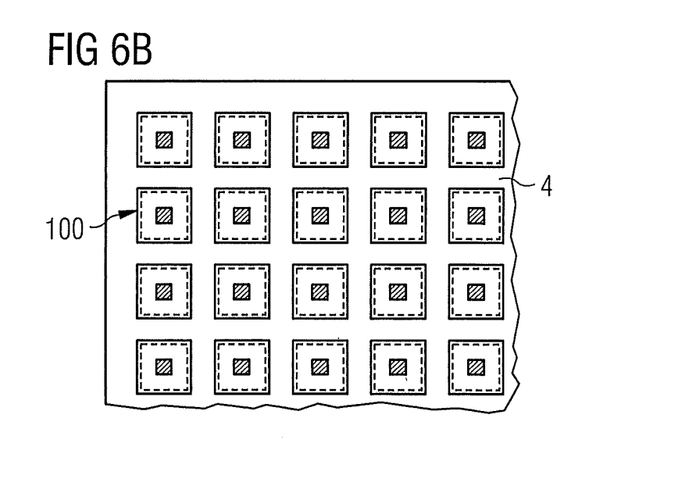

The examples of FIGS. 6A and 6B illustrate an arrangement comprising a plurality of semiconductor devices 100 arranged on a common carrier substrate 4. In this case, the devices 100 are formed in accordance with one of the preceding examples.

The arrangement of the example of FIG. 6A comprises linearly arranged semiconductor devices. The semiconductor devices 100 are arranged in particular next to one another on the flat carrier substrate 4. In this case, the semiconductor devices 100 are preferably at a substantially identical spaced interval with respect to each other.

The example of FIG. 6B comprises an arrangement in which the semiconductor devices 100 are arranged matrix-like on the preferably flat carrier substrate 4. In this case, it is not absolutely necessary that the arrangement as a whole is formed in a two-dimensional, planar manner. In particular, the carrier substrate 4 can also comprise a curved surface.

Our devices and methods are not limited by the description using the examples, but rather includes any new feature and combination of features included in particular in any combination of features in the appended claims, even if the features or combinations themselves are not explicitly stated in the claims or examples.

The invention claimed is:

1. An optoelectronic semiconductor device comprising:
at least one radiation-emitting semiconductor chip comprising a radiation passage surface and a mounting surface opposite the radiation passage surface, wherein the mounting surface comprises a first electrical contact structure and a second electrical contact structure electrically insulated from the first electrical contact structure, and wherein the radiation passage surface is free of contact structures,
a reflective sheath surrounding the at least one semiconductor chip at least in sections,
a protective sheath surrounding the at least one semiconductor chip or the reflective sheath at least in sections, and
a conversion element directly disposed on the radiation passage surface of the semiconductor chip that converts the radiation emitted by the semiconductor chip, at least partially into radiation of a different wavelength, wherein the conversion element is completely uncovered by the reflective sheath, wherein the protective sheath is formed by a casting compound and the reflective sheath is embedded into the casting compound.

2. The semiconductor device according to claim 1, wherein the semiconductor chip is a volume emitter and the semiconductor device is, by virtue of the reflective sheath, a surface emitter.

3. The semiconductor device according to claim 1, wherein at the mounting surface a region between the first electrical contact structure and the second electrical contact structure is free of material of the reflective sheath.

4. The semiconductor device according to claim 1, wherein the reflective sheath contains light-scattering or light-reflecting particles.

5. The semiconductor device according to claim 4, wherein the light-scattering or light-reflecting particles are $TiO_2$ particles, $BaSO_4$ particles, ZnO particles, $Al_xO_y$ particles and/or $ZrO_2$ particles.

6. The semiconductor device according to claim 1, wherein the reflective sheath comprises a silicone filled with light-scattering or light-reflecting particles.

7. The semiconductor device according to claim 1, wherein the reflective sheath is formed by a casting compound.

8. The semiconductor device according to claim 1, wherein at least one surface of the reflective sheath remote from the semiconductor chip is curved.

9. The semiconductor device according to claim 1, wherein the protective sheath is transparent to the radiation emitted by the semiconductor chip.

10. The semiconductor device according to claim 1, wherein the semiconductor chip and the reflective sheath are arranged on a carrier substrate and the reflective sheath extends from the carrier substrate to the semiconductor chip, wherein the reflective sheath extends at the most to an upper chip edge.

11. The semiconductor device according to claim 10, further comprising a border surrounding the semiconductor chip, wherein the reflective sheath is delimited by the circumferential border.

12. The semiconductor device according to claim 1, wherein in the radiation direction an optical element is disposed downstream of the semiconductor chip.

13. The semiconductor device according to claim 1, wherein the conversion element is a converter plate or a converter layer.

14. The semiconductor device according to claim 1, wherein the protective sheath is arranged spaced apart from the at least one semiconductor chip.

15. An optoelectronic semiconductor device comprising:
at least one radiation-emitting and/or radiation-receiving semiconductor chip comprising a radiation passage surface and a mounting surface opposite the radiation passage surface, wherein the mounting surface comprises a first electrical contact structure and a second electrical contact structure electrically insulated from the first electrical contact structure, and wherein the radiation passage surface is free of contact structures, a reflective sheath surrounding the at least one semiconductor chip at least in sections, and a protective sheath that mechanically stabilizes the device, and is a single housing of the device, a conversion element directly disposed on the radiation passage surface of the semiconductor chip, wherein the conversion element converts the radiation emitted by the semiconductor chip, at least partially into radiation of a different wavelength, the conversion element not being covered by the reflective sheath, wherein the protective sheath is transparent to the radiation emitted by the semiconductor chip, and the protective sheath surrounds the at least one semiconductor chip, the reflective sheath and the conversion element at least in sections.

* * * * *